United States Patent
Elliott

(10) Patent No.: US 10,637,216 B2
(45) Date of Patent: Apr. 28, 2020

(54) POWER CONTROL SYSTEM WITH IMPROVED THERMAL PERFORMANCE

(71) Applicant: GE Aviation Systems Limited, Cheltenham, Gloucestershire (GB)

(72) Inventor: David Alan Elliott, Cheltenham (GB)

(73) Assignee: GE Aviation Systems Limited, Grand Rapids, MI (US)

( * ) Notice: Subject to any disclaimer, the term of this patent is extended or adjusted under 35 U.S.C. 154(b) by 0 days.

(21) Appl. No.: 16/081,433

(22) PCT Filed: Apr. 4, 2017

(86) PCT No.: PCT/EP2017/058014
§ 371 (c)(1),
(2) Date: Aug. 31, 2018

(87) PCT Pub. No.: WO2017/174594
PCT Pub. Date: Oct. 12, 2017

(65) Prior Publication Data
US 2019/0058311 A1 Feb. 21, 2019

(30) Foreign Application Priority Data

Apr. 6, 2016 (GB) .................... 1605876.0

(51) Int. Cl.
*H02B 1/56* (2006.01)
*H05K 1/02* (2006.01)
(Continued)

(52) U.S. Cl.
CPC ............... *H02B 1/56* (2013.01); *H02B 1/04* (2013.01); *H05K 1/0203* (2013.01);
(Continued)

(58) Field of Classification Search
None
See application file for complete search history.

(56) References Cited

U.S. PATENT DOCUMENTS 4,626,954 A 12/1986 Damiano et al.
5,610,493 A 3/1997 Wieloch
(Continued)

FOREIGN PATENT DOCUMENTS

EP 3024307 A1 5/2016
GB 2216728 A 3/1989

OTHER PUBLICATIONS

International Search Report and Written Opinion dated Jul. 4, 2018 which was issued in connection with PCT application No. PCT/EP2017/058014 which was filed on Apr. 4, 2017.
(Continued)

*Primary Examiner* — Xanthia C Cunningham
(74) *Attorney, Agent, or Firm* — Dority & Manning, P.A.

(57) ABSTRACT

An electrical power distribution system is provided. The electrical power distribution system includes one or more power distribution cards comprising a first portion and a second portion. The electrical power distribution system further includes one or more power switching components coupled to the first portion of one of the one or more power distribution cards. The electrical power distribution system further includes one or more control devices configured to control operation of at least one of the one or more power switching components. Each control device is coupled to the second portion of one of the one or more power distribution cards. The first portion of each power distribution card is separated from the second portion, such that, during operation of the power distribution card, the control devices operate at a lower average temperature than the power switching components.

20 Claims, 4 Drawing Sheets

(51) Int. Cl.
*H05K 1/14* (2006.01)
*H05K 3/36* (2006.01)
*H05K 7/14* (2006.01)
*H02B 1/04* (2006.01)
*H05K 1/18* (2006.01)

(52) U.S. Cl.
CPC .......... *H05K 1/0265* (2013.01); *H05K 1/142* (2013.01); *H05K 1/18* (2013.01); *H05K 3/368* (2013.01); *H05K 7/1432* (2013.01); *B64D 2221/00* (2013.01); *H05K 2201/064* (2013.01); *H05K 2201/066* (2013.01); *H05K 2201/09972* (2013.01); *H05K 2201/10151* (2013.01); *H05K 2201/10166* (2013.01); *H05K 2201/10189* (2013.01)

(56) References Cited

U.S. PATENT DOCUMENTS

| | | | | |
|---|---|---|---|---|
| 5,748,451 | A * | 5/1998 | Thompson | H05K 1/0263 361/775 |
| 6,341,066 | B1 | 1/2002 | Murowaki et al. | |
| 6,882,538 | B1 | 4/2005 | Frisch | |
| 7,488,185 | B2 * | 2/2009 | Hashikura | H05K 7/026 439/76.2 |
| 7,561,430 | B2 * | 7/2009 | Tiedemann | H05K 1/0206 174/16.3 |
| 7,632,718 | B2 * | 12/2009 | Hosseini | H01L 23/49524 438/123 |
| 8,154,874 | B2 * | 4/2012 | Zhuang | H01L 23/5387 361/728 |
| 9,136,624 | B1 * | 9/2015 | Reynov | H01R 12/7082 |
| 9,871,439 | B2 * | 1/2018 | Li | H02M 1/44 |
| 2002/0166690 | A1 * | 11/2002 | Chiriku | H02G 3/08 174/60 |
| 2004/0246662 | A1 * | 12/2004 | Thurk | H02M 1/44 361/631 |
| 2006/0087782 | A1 | 4/2006 | Michalko et al. | |
| 2006/0109629 | A1 * | 5/2006 | Harris | H01L 23/433 361/704 |
| 2007/0099437 | A1 | 5/2007 | Hable | |
| 2008/0111535 | A1 | 5/2008 | Su et al. | |
| 2008/0112133 | A1 * | 5/2008 | Torudbakken | H04Q 1/04 361/694 |
| 2010/0231038 | A1 * | 9/2010 | Sugimura | B60R 16/0238 307/9.1 |
| 2011/0061930 | A1 | 3/2011 | Kazi et al. | |
| 2011/0317374 | A1 * | 12/2011 | Merlet | H05K 1/0263 361/732 |

OTHER PUBLICATIONS

Great Britain Search Report and Written Opinion dated Sep. 26, 2016 which was issued in connection with Great Britain Patent No. 1605876.0 which was filed on Apr. 6, 2016.

* cited by examiner

POWER CONTROL SYSTEM WITH IMPROVED THERMAL PERFORMANCE

FIELD OF INVENTION

The present subject matter relates generally to electrical power distribution systems.

BACKGROUND

Electrical systems associated with aircraft and other vehicles may have a plurality of electrical subsystems, each having one or more electrical power distribution systems. Such electrical power distribution systems may include one or more power distribution cards mounted vertically to the electrical system in a rack-like manner. Such power distribution cards may include one or more printed circuit boards having one or more switching devices configured to control current flow to a load associated with the electrical system. The printed circuit boards may further include one or more control devices configured to control operation of at least one switching device.

Conventional power distribution cards may have a layout configuration wherein one or more switching devices are located in close proximity to a corresponding control device. For instance, a switching device and a corresponding control device may be coupled to the power distribution card as part of a prefabricated solid state power controller (SSPC) "module." FIG. 1 depicts an example conventional power distribution card 100. As shown, card 100 includes SSPC blocks A-L, routing device 102, and card controller 104. Card 100 further includes connector 106 configured to connect card 100 to an electrical system. Each SSPC block A-L can be associated with one or more electrical subsystems. In particular, each SSPC block A-L can be configured to regulate current flow to a load associated with the corresponding electrical subsystem. As shown, each SSPC block A-L includes two power switching devices (e.g. power FETs), a current sensor, and control logic located in close proximity to each other.

During operation of card 100, the configuration of the SSCP blocks A-L can provide a generally even temperature distribution across card 100. Heat dissipation associated with the power FETs may be proportional to the square of the load current, while heat dissipation associated with the control logic may remain generally constant. Accordingly, when the load current associated with the power FETs is a high load current, the heat generated by the current flow will be much greater than that generated by the relatively low power control logic. In this manner, the control devices may experience an increased local temperature environment, which may reduce the reliability or cause unpredictable behavior in the control devices. For instance, if the average operating temperature of the control logic exceeds the specified maximum operating temperature of the control logic, the control logic may fail and/or act in an unpredictable manner.

BRIEF DESCRIPTION

Aspects and advantages of the present disclosure will be set forth in part in the following description, or may be learned from the description, or may be learned through practice of the examples disclosed herein.

One example aspect of the present disclosure is directed to an electrical power distribution system associated with an electrical system for an aircraft. The electrical power distribution system includes one or more power distribution cards. Each power distribution card comprises a first portion and a second portion. The electrical power distribution system further includes one or more power switching components. Each power switching component is coupled to the first portion of one of the one or more power distribution cards. The electrical power distribution system further includes one or more control devices. Each control device is configured to control operation of at least one of the one or more power switching components. Each control device is coupled to the second portion of one of the one or more power distribution cards. The first portion of each power distribution card is separated from the second portion, such that, during operation of the power distribution card, the control devices operate at a lower average temperature than the power switching components.

Another example aspect of the present disclosure is directed to a power distribution card associated with a power distribution system. The power distribution card includes one or more power switching components. Each power switching component is coupled to a first portion of the power distribution card. The power distribution card further includes one or more control devices configured to control operation of at least one of the one or more power switching components. Each control device is coupled to a second portion of the power distribution card. The first portion of the power distribution card is separated from the second portion, such that, during operation of the power distribution card, the control devices operate at a lower average temperature than the power switching components.

Yet another example aspect of the present disclosure is directed to an electrical system associated with an aircraft. The electrical system includes one or more power distribution systems comprising one or more power distribution cards. Each power distribution card includes one or more power switching components. Each power switching component is coupled to a first portion of one of the power distribution cards. Each power distribution card further includes one or more control devices configured to control operation of at least one of the one or more power switching components. Each control device is coupled to a second portion of one of the power distribution cards. The first portion of each power distribution card is separated from the second portion, such that, during operation of the power distribution card, the control devices operate at a lower average temperature than the power switching components.

Variations and modifications can be made to these example aspects of the present disclosure.

These and other features, aspects and advantages of various examples will become better understood with reference to the following description and appended claims. The accompanying drawings, which are incorporated in and constitute a part of this specification, illustrate aspects of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
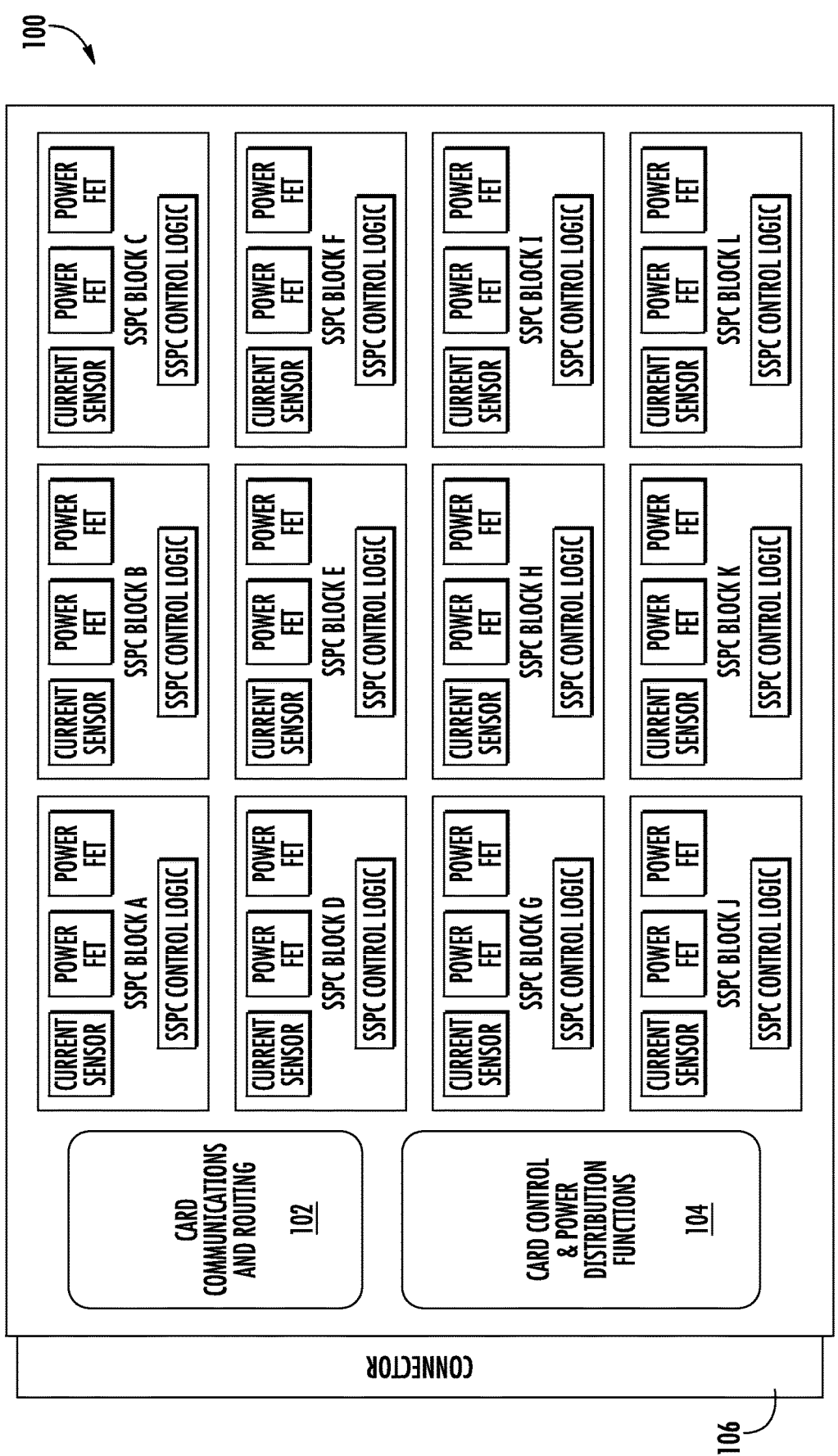
FIG. 1 depicts a conventional power distribution card associated with a power distribution system according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to electrical power distribution units having improved thermal performance. In some implementations, the power distribution units may be associated with an electrical system in an aircraft or other vehicle. It will be appreciated that such power distribution units may be implemented within various other suitable environments and/or applications without deviating from the scope of the present disclosure. For instance, each electrical power distribution unit can include a plurality of power distribution cards. Each power distribution card can include one or more power switching devices, such as one or more metal-oxide-semiconductor field-effect transistors (MOSFETs). The power switching devices can be configured to regulate current flow to a load associated with the electrical system. Each power switching device can have an associated control device configured to control operation of the power switching device.

In some implementations, each power distribution card can include an upper portion and a lower portion. The upper and lower portions can be oriented such that, when the power distribution cards are mounted or otherwise connected to the electrical system of the aircraft or other vehicle, the upper portion is located above the lower portion. For instance, the power distribution cards can be mounted to the electrical system in a vertical manner in a rack or box configuration, such that the upper portion is located above the lower portion. The power distribution cards can be configured such that the power switching devices are located on the upper portion of the power distribution card and the control devices are located on the lower portion of the power distribution card. In this manner, the power switching devices can be spatially separated from the control devices, thereby reducing the average operating temperature of the control devices relative to that of the power switching devices.

In particular, in some implementations, heat dissipation of the power switching devices can be proportional to the square of the load current flowing through the power switching devices, while the heat dissipation of the control devices can remain constant. In this manner, at higher load currents, the majority of heat dissipation can originate from the power switching devices, which also generally have a higher operating temperature tolerance than the control devices. By separating the power switching devices from the control devices, such that the power switching devices are located on the upper portion of the power distribution card and the control devices are located on the lower portion of the power distribution card, the average operating temperature of the control devices can be lower than that of the power switching devices during normal operation of the electrical power distribution system. In this manner, operating the components coupled to the upper portion of the power distribution card at a higher temperature can provide a greater temperature difference between the upper portion of the power distribution card and the environmental temperature. Such increased temperature difference can increase the heat flow rate and/or the heat dissipation capability of the system, which can lead to increased efficiency of the operation of the control devices.

In some implementations, the control devices can be configured to control operation of one or more power switching devices based at least in part on the current flowing through the power switching devices to a load associated with the electrical system. For instance, the power distribution card can further include one or more current sensors, each associated with one or more power switching devices. The current sensors may be included on the upper portion of the power distribution card. The current sensors can be configured to monitor current flow through the power switching device(s) and to provide a signal indicative of the current to the control device associated with the power switching device(s). The control device can compare the signal indicative of the current to a predetermined current threshold, and control operation of the power switching device(s) based at least in part on the comparison. For instance, if the signal indicative of the current is greater than the current threshold, the control device can provide one or more control signals to the power switching device(s) causing the power switching device to "turn off," thereby restricting or eliminating current flow through the power switching device(s). It will be appreciated that the control devices can be further configured to implement various other control tasks or functions, such as for instance, various functions relating to monitoring, switching, communications, and/or protection.

Each power distribution card can include one or more printed circuit boards. For instance, in some implementations, a power distribution card can include only a single printed circuit board, such that the upper portion and lower portions of the power distribution card are separate partitions or regions of the same printed circuit board. In some implementations, the upper and lower portions of the power distribution card can be made of different materials. For instance, the upper portion can be made from a material that is able to tolerate higher temperatures (e.g. ceramic), and the lower portion can be made from a different material that is not able to tolerate such high temperatures (e.g. FR4). In this manner, the power distribution card may include a single printed circuit board made up of two or more different materials (e.g. a high temperature material and a low temperature material). As another example, the power distribution card may include two or more printed circuit boards, each made of a different material.

In implementations wherein two or more printed circuit boards are used, a first printed circuit board may correspond to the upper portion of the power distribution card, and a second printed circuit board may correspond to the lower portion of the power distribution card. In such implementations, the two or more printed circuit boards may be connected via an interboard connection device. The interboard connection device may include board-to-board connectors, flexible printed circuits with discrete wires, and/or various other suitable connection mechanisms.

The electrical power distribution system may use passive cooling techniques, and/or active cooling techniques. For instance, the power distribution cards may rely solely on natural air convection to dissipate heat produced by the distribution system. In some implementations, one or more power distribution cards may include various suitable heat dissipation devices, such as one or more heat sinks, cold wall heat sinks, chimney structures, forced air devices, and/or various other suitable heat dissipation devices. In some implementations, thermal insulation may be provided between the upper and lower portions of the power distribution cards.

Figure 2:
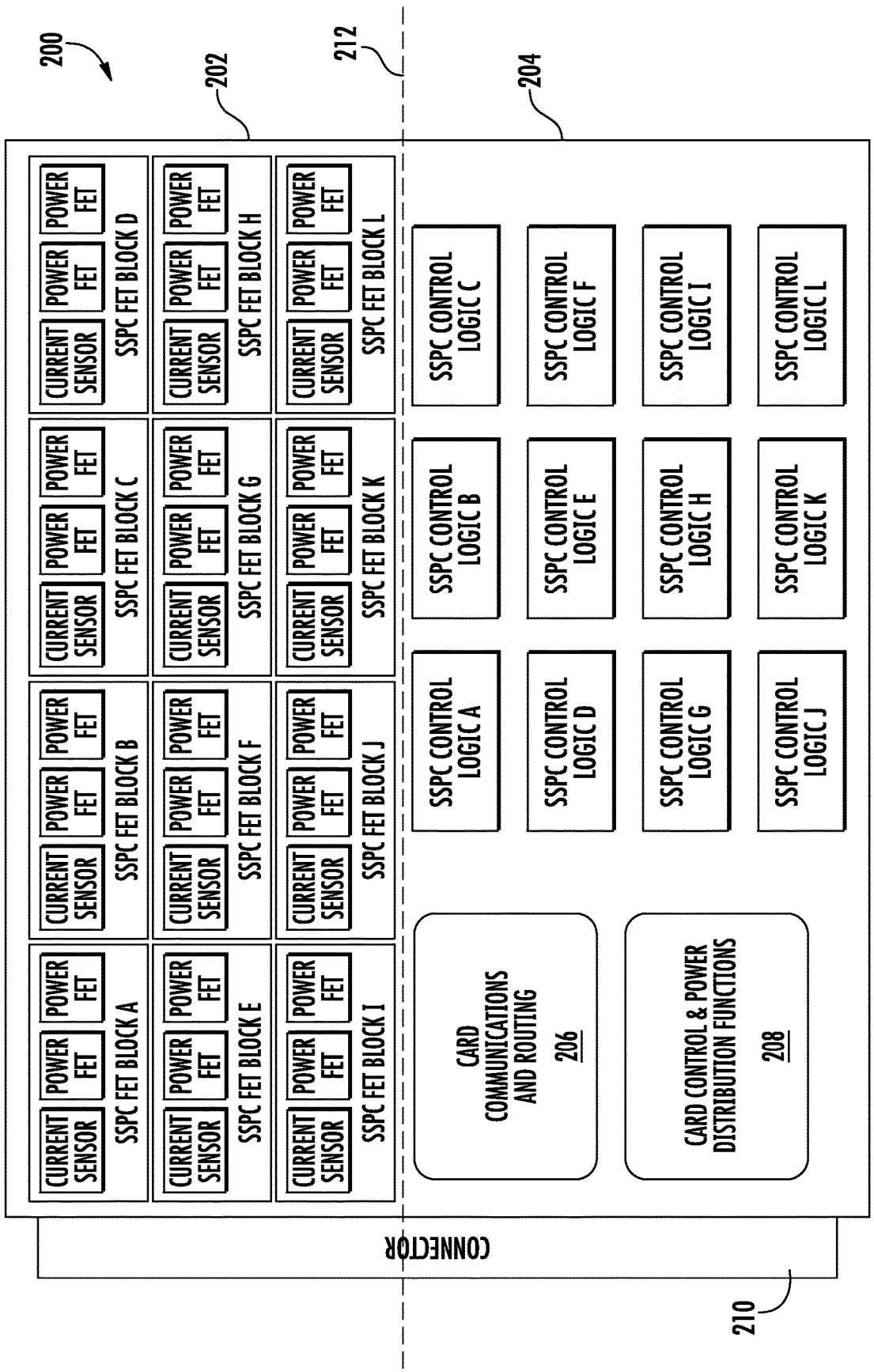
FIG. 2 depicts an overview of a power distribution card according to example embodiments of the present disclosure.

With reference now to the figures, example aspects of the present disclosure will be discussed in more detail. For instance, FIG. 2 depicts an overview of an example power distribution card 200 according to example embodiments of the present disclosure. Similar to card 100 of FIG. 1, card 200 includes a plurality of switching devices (e.g. power FETs), each having a corresponding current sensor and control logic. In some implementations, the switching devices can be silicon carbide power FETs, gallium nitride power FETs, or other switching device. In particular, card 200 includes FET blocks A-L, each having corresponding control logic A-L. Control logic A-L can include various suitable components or devices including, for instance, one or more processing devices, amplifiers, comparators, isolators, and/or other components configured to implement various control functions associated with the corresponding power FETs. Card 200 further includes routing device 206, card controller 208, and connector 210. Connector 210 can be configured to connect card 200 to an electrical system associated, for instance, with an aircraft or other vehicle. FET blocks A-L each include two power FETs and a current sensor configured to monitor a load current associated with the power FETs. It will be appreciated that the number of FETs (e.g. FET blocks and/or FETs per FET block) depicted in FIG. 2 is for illustrative purposes only and that various other suitable numbers of FETs can be used without deviating from the scope of the present disclosure. As shown, card 200 includes an upper portion 202 and a lower portion 204. Dashed line 212 provides an illustrative indication of the location of the divide between upper portion 202 and lower portion 204. FET blocks A-L are located in upper portion 202, while control logic A-L are located in lower portion 204.

As indicated above, during operation, such power FETs may generate more heat than control logic A-L. Further, the power FETs and current sensors are generally tolerant of higher temperatures, while control logic A-L may not be tolerant of such high temperatures. For instance, control logic A-L may have a maximum specified operating temperature of about 125 degrees Celsius, while the power FETs may be rated for a higher temperature. As used herein, the term "about," when used in conjunction with a numerical value is intended to refer to within 40% of the numerical value. It will be appreciated that various control logic having various other suitable temperature ratings may be used without deviating from the scope of the present disclosure. Configuring the component layout of card 200 in such fashion (e.g. separating the control logic from FET blocks A-L such that FET blocks A-L are located above control logic A-L) can increase the air flow and thermal performance associated with the electrical system and/or decrease the average operating temperature of control logic A-L, thereby improving the reliability and/or efficiency of control logic A-L.

It will be appreciated that, in some implementations, card 200 can further include various other suitable components or devices. For instance, card 200 can further include various resistors, capacitors, etc. Such additional components may be located on upper portion 202 of card 200.

In various implementations, card 200 may be configured to use passive cooling and/or active cooling techniques to dissipate heat. For instance, in implementations wherein active cooling techniques are used, card 200 may further include one or more associated heat dissipation devices, such as one or more fins or other heat sink devices, chimney structures, cold wall heat sinks, force air devices, etc. In addition, thermal insulation may be provided between upper portion 202 and lower portion 204.

In some implementations, the location of components relative to card 200 (e.g. upper portion 202 or lower portion 204) can be determined based at least in part on a specified temperature rating associated with the respective components. For instance, in such implementations, components can be attached or coupled to upper portion 202 of card 200 if the components have a specified maximum operating temperature above a threshold. Similarly, components can be attached or coupled to lower portion 204 if they have a specified maximum operating temperature below the threshold. In this manner, components that have a lower temperature tolerance may be separated from components that have a higher temperature tolerance, such that the high temperature components may be allowed to operate at a higher temperature than can be tolerated by the low temperature components.

Card 200 can be made of various suitable materials. For instance, in some implementations, card 200 can be made of a material capable of tolerating high temperatures (e.g. ceramic). In some implementations, card 200 can be made of multiple materials. For instance, upper portion 202 may be made of a high temperature material (e.g. ceramic), while lower portion 204 is made of a lower temperature material (e.g. FR4). In such implementations, card 200 may be made from one printed circuit board made from multiple materials.

Figure 4:
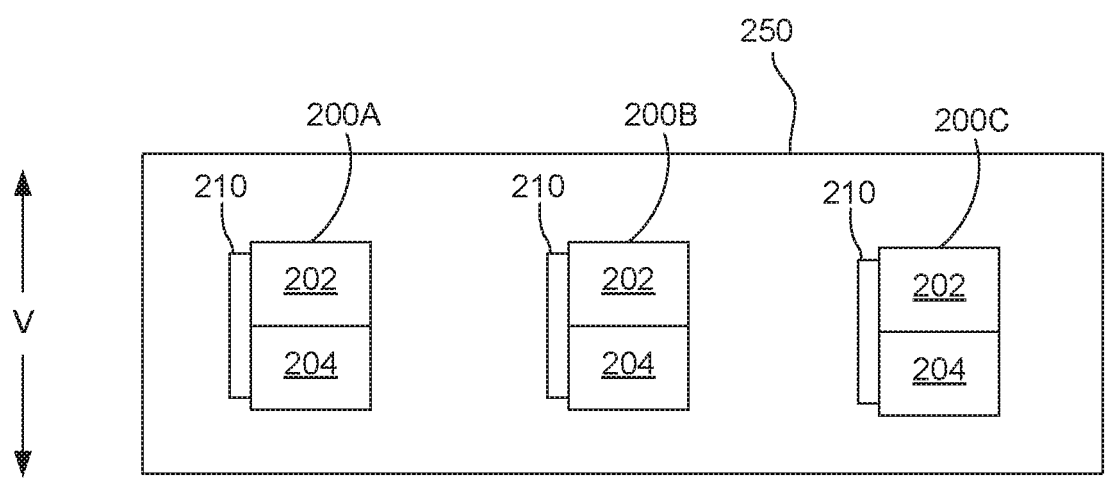
FIG. 4 depicts an example electrical system with power distribution cards connected thereto in a vertical manner.

FIG. 4 depicts an example electrical system 250 with power distribution cards connected thereto in a vertical manner. Particularly, as shown, the electrical system 250 has a first power distribution card 200A, a second power distribution card 200B, and a third power distribution card 200C. Each card 200A, 200B, and 200C has an upper portion 202 and a lower portion 204 as described above. Further, each card 200A, 200B, and 200C has a connector 210. The connectors 210 connect their respective cards 200A, 200B, and 200C to the electrical system 250. Notably, the upper and lower portions 202, 204 of the cards 200A, 200B, and 200C are oriented such that, when the power distribution cards 200A, 200B, 200C are mounted or otherwise connected to the electrical system 250 of the aircraft or other vehicle, the upper portion 202 is located above the lower portion 204 along a vertical direction V.

Figure 3:
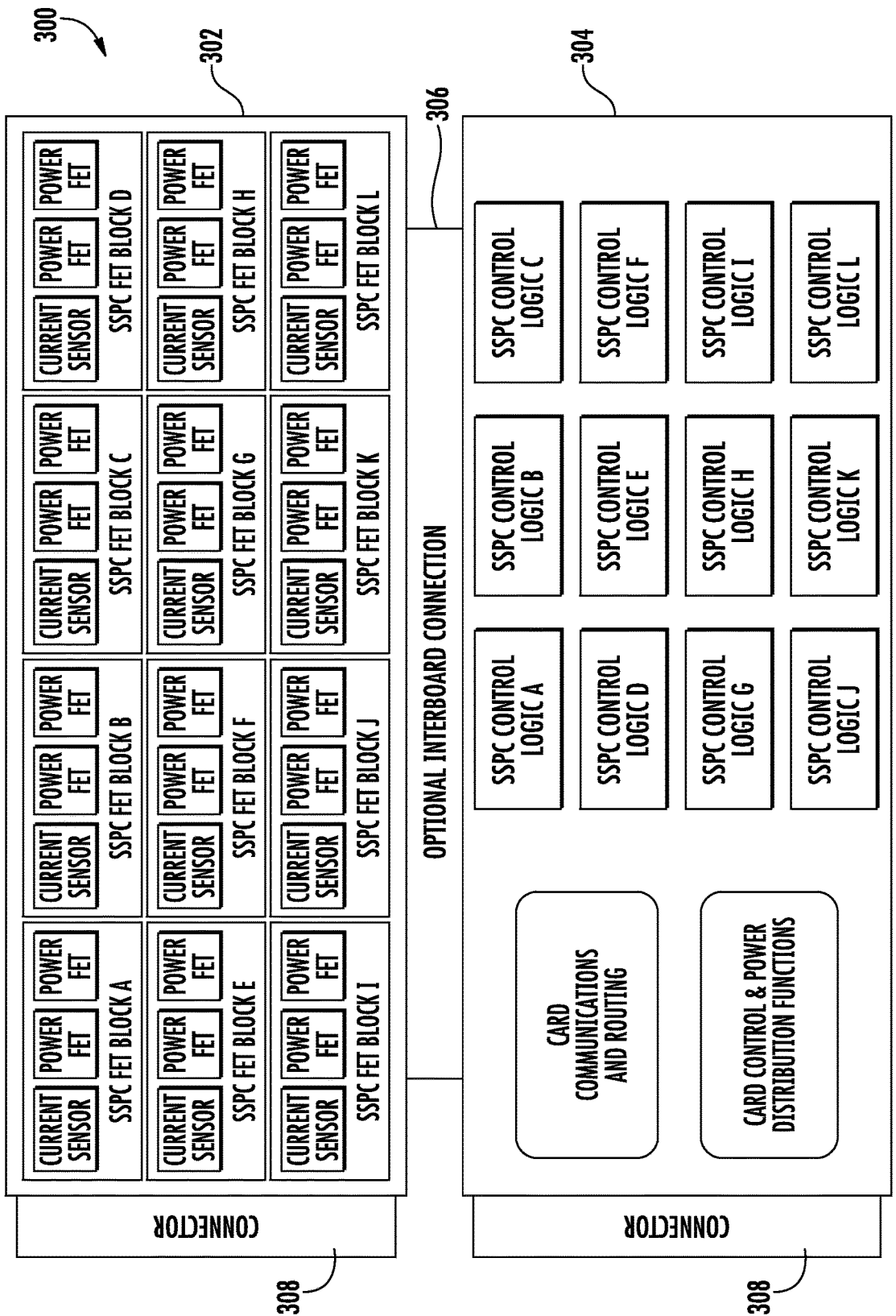
FIG. 3 depicts an overview of a power distribution card according to example embodiments of the present disclosure.

As indicated above, in some implementations, a power distribution card may include multiple printed circuit boards. For instance, FIG. 3 depicts an overview of an example power distribution card 300 according to example embodiments of the present disclosure. As depicted, card 300 includes an upper printed circuit board 302 and a lower printed circuit board 304. In particular, printed circuit board 302 can be a separate and distinct board from printed circuit board 304. The printed circuit boards 302, 304 can be connected using an interboard connection device 306, such as one or more board-to-board connectors, or flexible printed circuits and discrete wires. Printed circuit boards 302 and 304 may each have connectors 308 configured to connect the printed circuit boards to the electrical system.

Printed circuit board 302 can correspond to upper portion 202 of card 200 of FIG. 2. In this manner, printed circuit board 302 can include FET blocks A-L. As above, FET blocks A-L may include various components (e.g. power FETs, current sensors, various resistors, capacitors, etc.) that are capable of tolerating higher temperatures (e.g. temperatures above a threshold). In particular, as above, it will be appreciated that the number of FETs (e.g. FET blocks and/or FETs per FET block) depicted in FIG. 3 is for illustrative purposes only and that various other suitable numbers of FETs can be used without deviating from the scope of the present disclosure. In this manner, components that generate a large amount of heat and/or are able to tolerate high temperatures are positioned near the top of card 300. Similarly, printed circuit board 304 can correspond to lower portion 204 of card 200. Printed circuit board 304 can include control logic A-L. As indicated above, such control components that make up control logic A-L may not be rated to tolerate temperatures as high as the components that make up FET blocks A-L. In this manner, control logic A-L can be separated from FET blocks A-L, thereby maintaining a lower average operating temperature of control logic A-L during operation.

In some implementations, printed circuit board 302 may be made from a first material and printed circuit board 304 may be made from a second material. For instance, printed circuit board 302 may be made from a material capable of tolerating temperatures above a threshold, while printed circuit board 304 may be made from a material rated for lower temperatures. For instance, printed circuit board 302 may be made from a ceramic material, while printed circuit board 304 may be made from FR4. In such implementations, the power FETs may be able to operate at a higher temperature than can be tolerated by the material from which printed circuit board 304 is made.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

I claim:

1. An electrical power distribution system comprising:
   one or more power distribution cards, each power distribution card comprising a first portion and a second portion;
   one or more power switching components, wherein each power switching component is coupled to the first portion of one of the one or more power distribution cards;
   one or more control devices, each configured to control operation of at least one of the one or more power switching components, wherein each control device is coupled to the second portion of one of the one or more power distribution cards;
   wherein the first portion of each power distribution card is spatially separated from the second portion, such that, during operation of the power distribution card, the control devices operate at a lower average temperature than the power switching components; and
   wherein at least one power distribution card of the one or more power distribution cards comprises a single printed circuit board, and wherein the first portion of the power distribution card is made from a first material and the second portion of the power distribution card is made from a second material, the first material being different than the second material.

2. The electrical power distribution system of claim 1, wherein at least one power distribution card comprises a first printed circuit board and a second printed circuit board, such that the first printed circuit board comprises the first portion of the power distribution card and the second printed circuit board comprises the second portion of the power distribution card.

3. The electrical power distribution system of claim 2, wherein the first printed circuit board and the second printed circuit board are connected by an interboard connection device.

4. The electrical power distribution system of claim 2, wherein the first printed circuit board is made from a first material and the second printed circuit board is made from a second material.

5. The electrical power distribution system of claim 1, wherein the first material forming the first portion of the at least one power distribution card is more tolerable of higher temperatures than the second material forming the second portion of the at least one power distribution card.

6. The electrical power distribution system of claim 1, wherein the first portion and the second portion of the at least one power distribution card of the one or more power distribution cards that comprises the single printed circuit board is an upper portion and a lower portion, respectively, the upper portion being positioned vertically above the lower portion, and wherein all of the one or more power switching components of the at least one power distribution card are positioned vertically above the one or more control devices of the at least one power distribution card.

7. The electrical power distribution system of claim 1, further comprising one or more current sensors coupled to the first portion of the power distribution card, each of the one or more current sensors configured to monitor a current flowing to a load through at least one power switching component.

8. The electrical power distribution system of claim 7, wherein each current sensor is configured to provide one or more signals indicative of the current flowing to the load through the at least one power switching component to a control device, and wherein the control device is configured to control operation of the at least one of the one or more power switching components based at least in part on the signal indicative of the current.

9. The electrical power distribution system of claim 1, wherein each power distribution card is configured to be connected to the electrical system in a vertical manner such that, when connected, the first portion of each power distribution card is located above the second portion of the power distribution card.

10. The electrical power distribution system of claim 1, wherein at least one power distribution card further comprises one or more heat dissipation devices.

11. The electrical power distribution system of claim 10, wherein the one or more heat dissipation devices comprise one or more heat sink devices, one or more chimney devices, one or more cold wall heat sink devices, or one or more forced air devices.

12. The electrical power distribution system of claim 1, wherein thermal insulation is provided between the first portion of at least one power distribution card and the second portion of the at least one power distribution card.

13. The electrical power distribution system of claim 1, wherein the one or more power switching components comprise metal-oxide-semiconductor field-effect transistors.

14. The electrical power distribution system of claim 13, wherein the metal-oxide-semiconductor field-effect transistors comprise silicon carbide or gallium nitride metal-oxide-semiconductor field-effect transistors.

15. A power distribution card associated with a power distribution system, the power distribution card comprising:
one or more power switching components, wherein each power switching component is coupled to a first portion of the power distribution card; and
one or more control devices configured to control operation of at least one of the one or more power switching components, wherein each control device is coupled to a second portion of the power distribution card;
wherein the first portion of the power distribution card is separated from the second portion, such that, during operation of the power distribution card, the control devices operate at a lower average temperature than the power switching components.

16. The power distribution card of claim 15, wherein the power distribution card comprises a first printed circuit board and a second printed circuit board, such that the first printed circuit board comprises the first portion of the power distribution card and the second printed circuit board comprises the second portion of the power distribution card.

17. The power distribution card of claim 16, wherein the first printed circuit board is made from a first material and the second printed circuit board is made from a second material.

18. The power distribution card of claim 17, wherein the first material is a ceramic material, and wherein the second material is FR4.

19. The power distribution card of claim 15, wherein thermal insulation is provided between the first portion of the power distribution card and the second portion of the power distribution card.

20. An electrical system associated with an aircraft, the electrical system comprising:
one or more power distribution systems comprising one or more power distribution cards, each power distribution card comprising:
one or more power switching components, wherein each power switching component is coupled to a first portion of one of the power distribution cards; and
one or more control devices configured to control operation of at least one of the one or more power switching components, wherein each control device is coupled to a second portion of one of the power distribution cards;
wherein the first portion of each power distribution card is separated from the second portion, such that, during operation of the power distribution card, the control devices operate at a lower average temperature than the power switching components.

* * * * *